(12) United States Patent
Wu et al.

(10) Patent No.: US 8,125,290 B2
(45) Date of Patent: Feb. 28, 2012

(54) APPARATUS FOR SILENCING ELECTROMAGNETIC NOISE

(75) Inventors: Tzong-Lin Wu, Taipei (TW);
Ting-Kuang Wang, Taipei (TW);
Hao-Hsieh Chuang, Taipei (TW);
Chia-Yuan Hsieh, Taipei (TW)

(73) Assignee: National Taiwan University, Taipei (TW)

( * ) Notice: Subject to any disclaimer, the term of this patent is extended or adjusted under 35 U.S.C. 154(b) by 480 days.

(21) Appl. No.: 12/353,312

(22) Filed: Jan. 14, 2009

(65) Prior Publication Data
US 2009/0289734 A1 Nov. 26, 2009

(30) Foreign Application Priority Data

May 22, 2008 (TW) ................................ 97118848 A

(51) Int. Cl.
*H01P 1/201* (2006.01)
(52) U.S. Cl. ............................ 333/12; 333/202; 333/204
(58) Field of Classification Search .................... 333/12, 333/202, 204; 361/780, 794
See application file for complete search history.

(56) References Cited

U.S. PATENT DOCUMENTS

| 6,133,805 A * | 10/2000 | Jain et al. .......................... 333/1 |
| 7,123,118 B2 * | 10/2006 | McKinzie, III ............... 333/219 |
| 7,215,007 B2 * | 5/2007 | McKinzie et al. ............ 257/664 |

* cited by examiner

*Primary Examiner* — Robert Pascal
*Assistant Examiner* — Kimberly Glenn
(74) *Attorney, Agent, or Firm* — Peter F. Corless; Steven M. Jensen; Edwards Wildman Palmer LLP

(57) ABSTRACT

Proposed is an apparatus for silencing electromagnetic noise, characterized by a plurality of centrally symmetrical ring-shaped through-via-hole crystalline units provided between a high voltage plane and a low voltage plane at a regular interval, thereby forming an omnidirectional noise suppression frequency band for reducing noise interference and electromagnetic radiation. In a first embodiment of the ring-shaped through-via-hole crystalline units, the through via holes are perpendicularly coupled between a metal plane and the low voltage plane. In a second embodiment of the ring-shaped through-via-hole crystalline units, the through via holes are perpendicularly coupled between two metal planes. Positioned at a regular interval, the through via holes enable provision of omnidirectional noise suppression frequency band, simplified design of a power plane, and reduction of production costs.

18 Claims, 4 Drawing Sheets

APPARATUS FOR SILENCING ELECTROMAGNETIC NOISE

BACKGROUND OF THE INVENTION

1. Field of the Invention

The present invention relates to apparatuses for silencing electromagnetic noise, and more specifically, to an apparatus for silencing electromagnetic noise and configured for use with integrated circuits and printed circuit boards.

2. Description of Related Art

High frequency digital circuit design is moving toward the trend of high speed, small volume, and low voltage. As such, the effect of the ground bounce noise (GBN) in the integrated circuit on the circuit system is also becoming more and more obvious.

Ground bounce noise is a transient voltage generated between a power plane and a ground plane during high speed switching of integrated circuit in a high-speed digital circuit, thereby forming parasitic noise at the connection of the signal line and the power plane. In addition, as the switching speed of the system gets faster, and the number of IC pins with simultaneous logic state conversion increases, the phenomenon of the ground bounce noise will become more significant.

In the conventional ground bounce noise suppression technique, the most frequently used method is to increase the number of decoupling capacitors around the noise source so as to offset the fluctuation of the voltage wave traveling through the plane. If a plurality of capacitors are peripherally provided on the IC susceptible to the interference, a capacitor wall can then be formed to contain the signal energy inside the wall.

However, as the high frequency circuit layout gets more complex on a very large-scale integrated circuit, adding a capacitor wall to a complex circuit design will significantly increase the complexity of the circuit layout. In addition, capacitor is a passive component of a relatively large size, thus if a plurality of capacitive components are used to form the enclosed capacitor wall, cost and space of the integrated circuit will definitely be increased.

Another conventional method to suppress ground bounce noise is to cut a rectangular crevice on the power plane or the ground plane, thereby containing the noise inside the crevice so as to avoid the internal noise to interfere with the function of other external components.

However, there are disadvantages of cutting crevices on the power plane to suppress the ground bounce noise effect, namely reduction of the power plane area, and interruption of the DC power offset inside and outside the crevices. As the internal signal line is coupled to the external components, crevices must be crossed, thereby generating more serious signal quality and electromagnetic radiation problems.

In order to avoid the signal quality and electromagnetic radiation problems generated as the connection of the internal signal line and the external components crosses crevices, a small through route is technically reserved at the surroundings of the crevices, thereby maintaining the consistency of the internal and external offsets. However, this would allow the inrush current to traverse the external part to lower the suppressing effect of the crevices cut.

Finally, referring to FIG. 1, a diagram of conventional technique is shown. As shown in the diagram, cylinders of a high dielectric constant are placed between a power plane and a ground plane at a regular interval, thereby forming an omni-directional noise suppression frequency band. However, the cost of manufacturing such cylinders of a high dielectric constant is very high and a special process is required. Hence the manufacturing cost of this technique is usually higher than any other techniques.

In summary, it has become an urgent issue to designers of the field to develop a key technology to provide an apparatus that suppresses ground bounce noise to avoid the drawback such as significant increase in the cost and space of the integrated circuit due to the use of an enclosed capacitor wall, and eliminates the signal quality and electromagnetic radiation problems generated as the connection of the internal signal line and the external components crosses crevices. In addition, the apparatus shall also lower the high cost required in manufacturing cylinders of a high dielectric constant.

SUMMARY OF THE INVENTION

In view of disadvantages of the above-mentioned technique, a primary objective of the present invention is to provide an apparatus for silencing electromagnetic noise, thereby avoiding the drawback such as significant increase in the cost and space of the integrated circuit due to the use of an enclosed capacitor wall, eliminating the signal quality and electromagnetic radiation problems generated as the connection of the internal signal line and the external components crosses crevices, as well as lowering the high cost required in manufacturing cylinders of a high dielectric constant.

In order to achieve the aforementioned objective, the present invention provides an apparatus for silencing electromagnetic noise. The apparatus comprises at least a high voltage power plane, a low voltage ground plane, a metal plane between the high voltage power plane and the low voltage ground plane, and a plurality of blind through via holes formed by the printed circuit process.

In particular, each of the through via holes is perpendicularly coupled between the metal plane and the low voltage plane, and the through via holes are peripherally provided on the metal plane so as to be arranged in the form of a ring-shaped through-via-hole array structure, thereby allowing the metal plane and the through via holes to form a ring-shaped through-via-hole crystalline unit.

In principle, the metal plane can be of any shapes. However, in the field of the electromagnetism, a symmetrical structure generally avoids unnecessary noise. Hence a preferred embodiment adopts centrally symmetrical metal planes with shapes such as circle, rectangle and polygon. The through via holes are then arranged in such a way that the through via holes are peripherally provided on each of the metal planes that are centrally symmetrical.

Also, the more the number of the through via holes that the ring-shaped through-via-hole crystalline unit has, the ring-shaped through-via-hole array structure will be denser and firmer. In this way, the ring-shaped through-via-hole crystalline unit will have a better isolation effect.

It shall be specifically stressed that a symmetrical structure in the field of electromagnetism usually prevents generation of unnecessary noise. Hence, in a preferred embodiment, the through via holes in the ring-shaped through-via-hole crystalline unit have to be peripherally provided on the metal plane and be symmetrical about the centrally symmetrical point of the metal plane, thereby symmetrically installing the ring-shaped through-via-hole array structure.

In other words, if the metal plane is a circular planar structure, then the through via holes are peripherally provided on the circular planar structure and symmetrical about the centrally symmetrical point of the circular planar structure, such that the through via holes peripherally provided on the circular planar structure are arranged in the form of a ring-shaped through-via-hole array structure. If the metal plane is a rectangular planar structure, then the through via holes are peripherally provided on the rectangular planar structure and symmetrical about the centrally symmetrical point of the rectangular planar structure, such that the through via holes peripherally provided on the rectangular planar structure are arranged in the form of a ring-shaped through-via-hole array structure. If the metal plane is a polygonal planar structure, then the through via holes are peripherally provided on the polygonal planar structure and symmetrical about the centrally symmetrical point of the polygonal planar structure, such that the through via holes peripherally provided on the polygonal planar structure are arranged in the form of a ring-shaped through-via-hole array structure.

Finally, the apparatus for silencing electromagnetic noise of the present invention includes a plurality of ring-shaped through-via-hole crystalline units, and allows the plurality of ring-shaped through-via-hole crystalline units to be arranged in a regular interval between a high voltage power plane and a low voltage ground plane. An omnidirectional noise suppression frequency band is then formed between the high voltage power plane and the low voltage ground plane.

In addition, in order to achieve the aforementioned objectives, the present invention further provides an apparatus for silencing electromagnetic noise. The apparatus comprises at least a high voltage power plane, a low voltage ground plane, two metal planes between the high voltage power plane and the low voltage ground plane, and a plurality of blind through via holes formed by a printed circuit process.

In particular, each of the through via holes is perpendicularly coupled between the two metal planes, and the through via holes are peripherally provided on the metal plane so as to be arranged in the form of a ring-shaped array structure, and in consequence the two metal planes and the through via holes together form a ring-shaped through-via-hole crystalline unit.

Finally, the apparatus for silencing electromagnetic noise of the present invention further includes a plurality of ring-shaped through-via-hole crystalline units, and allows the plurality of ring-shaped through-via-hole crystalline units to be arranged in a regular interval between a high voltage power plane and a low voltage ground plane. An omnidirectional noise suppression frequency band is then formed between the high voltage power plane and the low voltage ground plane.

In summary, two types of the apparatus for silencing electromagnetic noise according to the present invention generate an omnidirectional noise suppression frequency band so as to avoid the drawback such as a significant increase in the cost and space of the integrated circuit due to the use of an enclosed capacitor wall, eliminate the signal quality and electromagnetic radiation problems generated as the connection of the internal signal line and the external components crosses crevices, as well as overcome the high cost required in manufacturing cylinders of a high dielectric constant, thereby providing the design field with a noise suppression frequency band having the advantages of low cost, high efficiency and omnidirection.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The following embodiments further illustrate the points of the present invention in detail, however the scope of the invention is not limited to any points. In addition, the objects in the diagrams serve the purpose of explaining the structural relationship between objects and the actual size of each object does not limit the ratio of the embodiments.

First Embodiment

Figure 1:
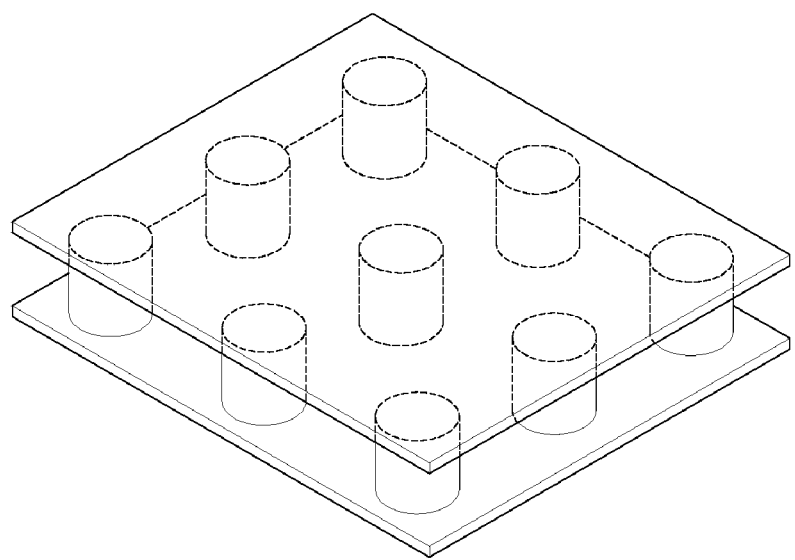
FIG. 1 is a schematic view showing a conventional technique.
Figure 2:
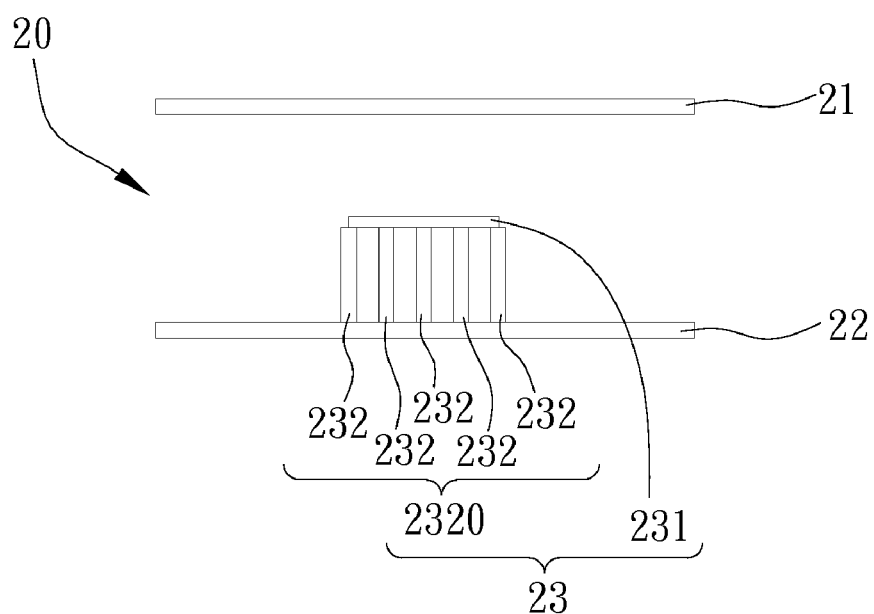
FIG. 2 is a schematic view of a first embodiment of the present invention.

First of all, referring now to FIG. 2, a schematic view of a first embodiment of the present invention is illustrated. As shown in the diagram, an apparatus for silencing electromagnetic noise 20 of the present invention comprises at least a high voltage plane 21, a low voltage plane 22, a metal plane 231 between the high voltage plane 21 and the low voltage 22 plane, and a plurality of through via holes 232 perpendicularly coupled between the metal plane 231 and the low voltage plane 22.

In particular, the high voltage plane 21 and the low voltage plane 22 together form a pair of parallel planes, namely power plane and ground plane, respectively. The metal plane 231 is a printed circuit metallic plane coupled between the high voltage plane 21 and the low voltage plane 22.

Subsequently, considering a manufacturing process for the printed circuit, the present embodiment proposes forming blind holes by the relevant manufacturing process for the printed circuit, such that the through via holes 232 are peripherally provided on the metal plane 231 and perpendicularly coupled between the metal plane 231 and the low voltage plane 22, so as to allow the through via holes 232 peripherally provided on the metal plane 231 to be arranged in the form of a ring-shaped through-via-hole array structure 2320. Also, the ring-shaped through-via-hole array structure 2320 and the metal plane 231 together form a ring-shaped through-via-hole crystalline unit 23. In a preferred embodiment, the through via holes 232 are hollow or filled.

It is to be explained that, in principle, the more the number of the through via holes 232 that the ring-shaped through-via-hole crystalline unit 23 has, the denser the ring-shaped through-via-hole array structure 2320, then the ring-shaped through-via-hole crystalline unit 23 shall have a better effect. In consideration of the manufacturing process cost and the structure stability, an overabundance of the through via holes 232 is unnecessary; instead, a designer should, after evaluating the cost and the structure stability, uses an appropriate, reasonable number of the through via holes 232 required by the ring-shaped through-via-hole crystalline unit 23.

Figure 3A:
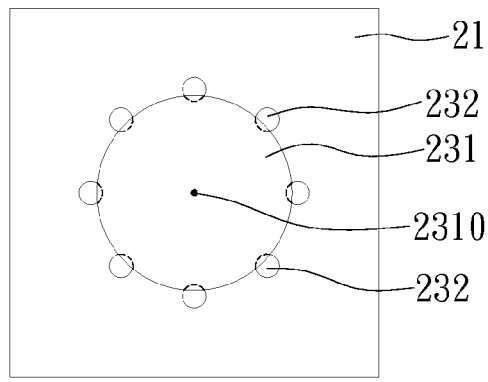
FIG. 3*a* illustrates a first top view of a ring-shaped through-via-hole crystalline unit of the present invention.
Figure 3B:
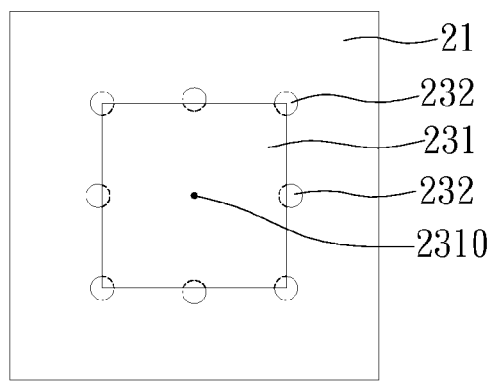
FIG. 3*b* illustrates a second top view of a ring-shaped through-via-hole crystalline unit of the present invention.
Figure 3C:
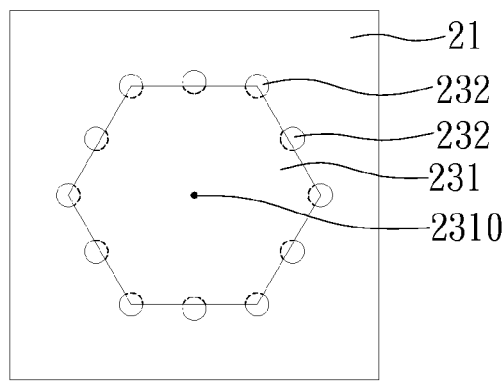
FIG. 3*c* illustrates a third top view of a ring-shaped through-via-hole crystalline unit of the present invention.

Hereupon, FIGS. 3a, 3b and 3c respectively illustrate a first top view, a second top view, and a third top view of a ring-shaped through-via-hole crystalline unit of the present invention. As shown in the above three diagrams, the metal plane 231 can be of any shape in principle. However, considering that in the design field of electromagnetism, a symmetrical structure usually offsets and therefore lowers unwanted noise due to its symmetry. Hence, in a preferred embodiment shown in FIGS. 3a, 3b and 3c, the metal plane 231 of centrally symmetrical shape, such as circle, rectangle, and polygon, is used. Likewise, considering that a symmetrical structure is capable of suppressing additional noise, in a preferred embodiment, the through via holes 232 of the ring-shaped through-via-hole crystalline unit 23 are symmetrical about the centrally symmetrical point of the metal plane 231, and in consequence the through via holes 232 are arranged in the form of the ring-shaped through-via-hole array structure 2320.

In other words, as shown in FIG. 3a, in the situation where the metal plane 231 is a circular planar structure, the through via holes 232 are peripherally provided on the circular planar structure and symmetrical about the centrally symmetrical point 2310 of the circular planar structure, and in consequence the through via holes 232 peripherally provided on the circular planar structure are arranged in the form of the ring-shaped through-via-hole array structure 2320. If, as illustrated in FIG. 3b, the metal plane 231 is a rectangular planar structure, then the through via holes 232 are peripherally provided on the rectangular planar structure and symmetrical about the centrally symmetrical point 2310 of the rectangular planar structure, and in consequence the through via holes 232 peripherally provided on the rectangular planar structure are arrange in the form of the ring-shaped through-via-hole array structure 2320. If, as shown in FIG. 3c, the metal plane 231 is a polygonal planar structure, then the through via holes 232 are peripherally provided on the polygonal planar structure and symmetrical about the centrally symmetrical point 2310 of the polygonal planar structure, and in consequence the through via holes 232 peripherally provided on the polygonal planar structure are arrange in the form of the ring-shaped through-via-hole array structure 2320.

It shall be specifically emphasized that as shown in FIGS. 3a, 3b and 3c, each of the through via holes 232 crosses the boundary of the metal plane 231 perpendicularly. In fact, embodiment of the present invention is not limited to perpendicular crossing of the boundary of the metal plane 231 by each of the through via holes 232. In other words, regarding the embodiment of each of the through via holes 232 crossing the boundary of the metal plane 231 perpendicularly, there is no specific limitation, because the effect of the present invention will be achieved, provided that the through via holes 232 are peripherally provided on the metal plane 231 so as to be arranged in the form of a ring-shaped through-via-hole array structure 2320.

Figure 4:
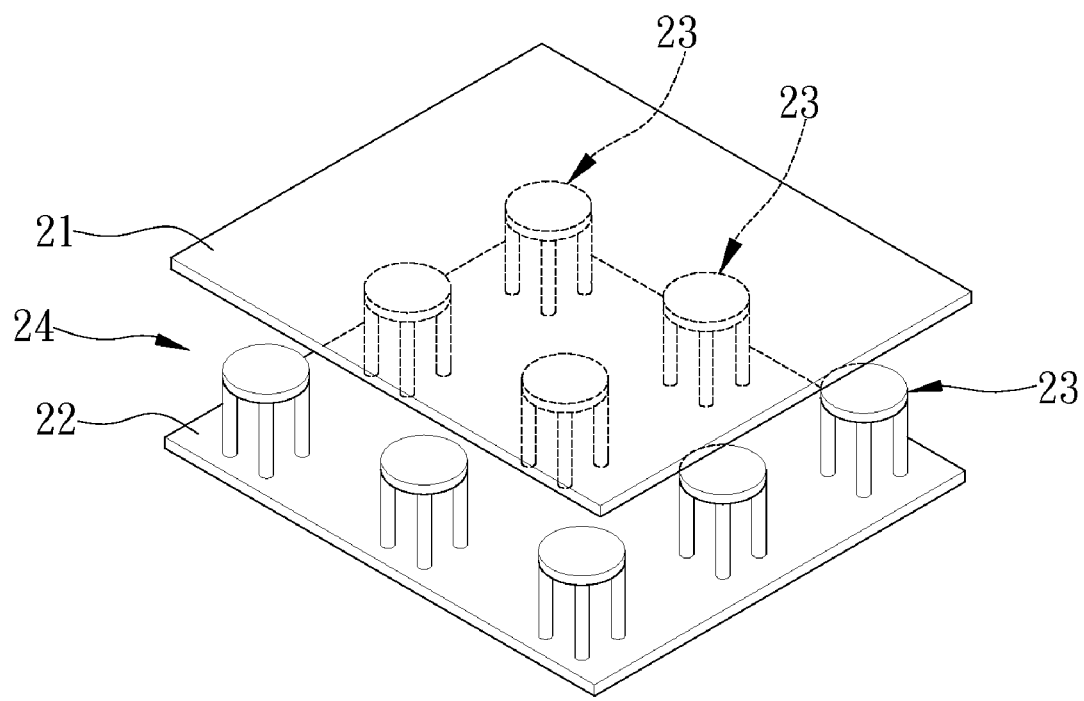
FIG. 4 is a schematic view of an embodiment of an apparatus for silencing electromagnetic noise according to the present invention.

Referring now to FIG. 4, a schematic view of an embodiment of an apparatus for silencing electromagnetic noise according to the present invention is shown. As depicted in the diagram, in a preferred embodiment of the apparatus for silencing electromagnetic noise according to the present invention, a plurality of ring-shaped through-via-hole crystalline units 23 are provided between the high voltage plane 21 and the low voltage plane 22 which are parallel, and, more particularly, the ring-shaped through-via-hole crystalline units 23 are provided between the high voltage plane 21 and the low voltage plane 22 at a regular interval, thereby forming an omnidirectional noise suppression frequency band 24 between the high voltage plane 21 and the low voltage plane 22.

Second Embodiment

Figure 5:
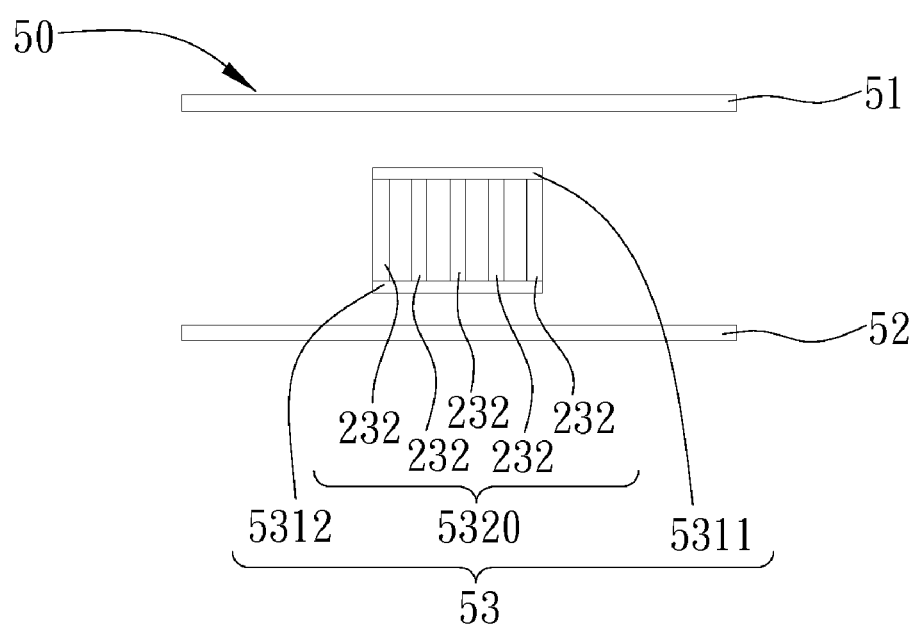
FIG. 5 is a schematic view showing a second embodiment of the present invention.

Besides, FIG. 5 is a schematic view showing a second embodiment of the present invention. As shown in the diagram, the present embodiment is derived from the same design concept of the previous embodiment. The only difference is that the apparatus for silencing electromagnetic noise 50 of the present embodiment includes a high voltage plane 51, a low voltage plane 52, two metal planes 5311, 5312 between the high voltage plane 51 and the low voltage plane 52 and a plurality of through via holes 532. Each of the through via holes 532 is perpendicularly connected between the metal plane 5311 and the metal plane 5312. The through via holes 532 are together peripherally provided on the metal plane 5311 and metal plane 5312 so as to be arranged in the form of a ring-shaped through-via-hole array structure 5320. The metal plane 5311, the metal plane 5312, and the through via holes 532 together form a ring-shaped through-via-hole crystalline unit 53.

Figure 6:
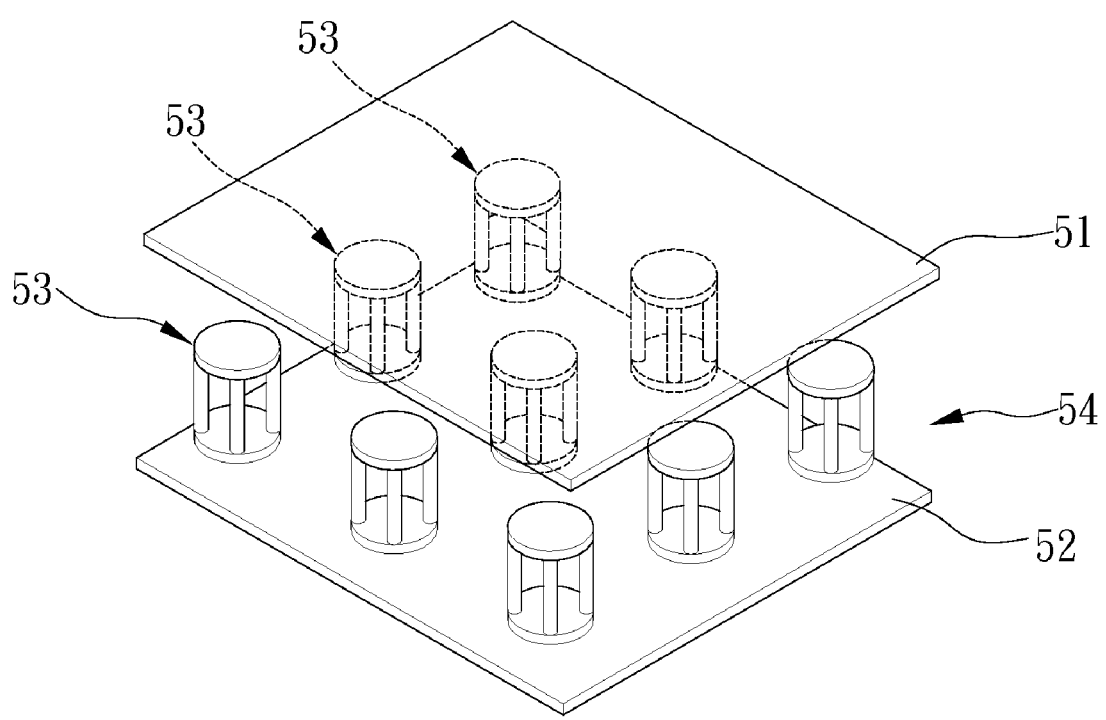
FIG. 6 is a schematic view of a variant embodiment of an apparatus for silencing electromagnetic noise of the present invention.

Referring now to FIG. 6, a schematic view of a variant embodiment of an apparatus for silencing electromagnetic noise 50 of the present invention is illustrated. As shown in the diagram, in a preferred embodiment of the apparatus for silencing electromagnetic noise according to the present invention, a plurality of ring-shaped through-via-hole crystalline units 53 are provided between the high voltage plane 51 and the low voltage plane 52 which are parallel, and, more particularly, the ring-shaped through-via-hole crystalline units 53 are provide between the high voltage plane 51 and the low voltage plane 52 at a regular interval, thereby forming an omnidirectional noise suppression frequency band 54 between the high voltage plane 51 and the low voltage plane 52.

In summary, two types of the apparatus for silencing electromagnetic noise according to the present invention generate an omnidirectional noise suppression frequency band so as to avoid the drawback such as significant increase in the cost and space of the integrated circuit due to the use of an enclosed capacitor wall, eliminate the signal quality and electromagnetic radiation problems generated as the connection of the internal signal line and the external components crosses crevices, as well as overcome the high cost required in manufacturing cylinders of a high dielectric constant, thereby providing the design field with a noise suppression frequency band having the advantages of low cost, high efficiency and omnidirectional.

While the invention has been particularly shown and described with reference to preferred embodiments for purposes of illustration, it will be understood that variations and modifications can be effected thereto by those skilled in the art without departing from the spirit and scope of the invention as defined by the appended claims.

What is claimed is:
1. An apparatus for silencing electromagnetic noise, comprising:
   a high voltage plane and a low voltage plane;
   a metal plane between the high voltage plane and the low voltage plane; and
   a plurality of through via holes each perpendicularly coupled between the metal plane and the low voltage plane and together peripherally provided on the metal plane so as to be arranged in form of a centrally-symmetrical ring-shaped through-via-hole array structure.

2. The apparatus of claim 1, further comprising a power plane substrate for use with a packaged circuit.

3. The apparatus of claim 1, further comprising a power plane substrate for use with a printed circuit.

4. The apparatus of claim 1, wherein each of the through via holes is hollow or filled.

5. The apparatus of claim 1, wherein the high voltage plane is a power plane and the low voltage plane is a ground plane.

6. The apparatus of claim 1, wherein the metal plane and the through via holes together form a ring-shaped through-via-hole crystalline unit.

7. The apparatus of claim 6, further comprising a plurality of the ring-shaped through-via-hole crystalline units.

8. The apparatus of claim 7 wherein the ring-shaped though-via-hole crystalline units are arranged at a regular interval.

9. The apparatus of claim 1, wherein the metal plane is one selected from a group consisting of a circular plane structure, a rectangular plane structure, and a polygonal plane structure.

10. An apparatus for silencing electromagnetic noise, comprising:
   a high voltage plane and a low voltage plane;
   two metal planes between the high voltage plane and the low voltage plane; and
   a plurality of through via holes each perpendicularly coupled between the two metal planes and together peripherally provided on the metal plane so as to be arranged in form of a centrally-symmetrical ring-shaped array structure.

11. The apparatus of claim 10, further comprising a power plane substrate for use with a packaged circuit.

12. The apparatus of claim 10, further comprising a power plane substrate for use with a printed circuit.

13. The apparatus of claim 10, wherein each of the through via holes is hollow or filled.

14. The apparatus of claim 10, wherein the high voltage plane is a power plane and the low voltage plane is a ground plane.

15. The apparatus of claim 10, wherein the metal plane and the through via holes together form a ring-shaped through-via-hole crystalline unit.

16. The apparatus of claim 15, further comprising a plurality of the ring-shaped through-via-hole crystalline units.

17. The apparatus of claim 16 wherein the ring-shaped though-via-hole crystalline units are arranged at a regular interval.

18. The apparatus of claim 10, wherein each of the metal planes is one selected from a group consisting of a circular plane structure, a rectangular plane structure, and a polygonal plane structure.

* * * * *